United States Patent
Kiely et al.

[11] Patent Number: 6,151,344
[45] Date of Patent: Nov. 21, 2000

[54] AUTOMATIC POWER CONTROL OF SEMICONDUCTOR LASER

[75] Inventors: Philip Kiely; Paul R. Claisse, both of Gilbert, Ariz.

[73] Assignee: Motorola, Inc., Schaumburg, Ill.

[21] Appl. No.: 09/050,205

[22] Filed: Mar. 30, 1998

[51] Int. Cl.$^7$ .................................. H01S 3/00; H01S 5/00
[52] U.S. Cl. ................................... 372/38; 372/33; 372/43
[58] Field of Search ................................... 372/38, 43, 50, 372/33, 29, 31

[56] References Cited

U.S. PATENT DOCUMENTS

| | | | |
|---|---|---|---|
| 4,856,008 | 8/1989 | Senma et al. | 372/31 |
| 4,856,011 | 8/1989 | Shimada et al. | 372/38 |
| 5,032,879 | 7/1991 | Buchmann et al. | 372/50 |
| 5,050,177 | 9/1991 | Ema | 372/38 |
| 5,097,473 | 3/1992 | Taguchi | 372/38 |
| 5,138,623 | 8/1992 | Ema et al. | 372/38 |
| 5,345,462 | 9/1994 | Choquette | 372/45 |

OTHER PUBLICATIONS

Thompson, Physics of Semiconductor Laser Devices, New York: John Wiley & Sons, 1980, p. 37, (no month available.

*Primary Examiner*—Teresa M. Arroyo
*Assistant Examiner*—Quyen P. Leung
*Attorney, Agent, or Firm*—Sharon K. Coleman; William E. Koch

[57] ABSTRACT

Automatic power control of a semiconductor laser (12, 72) is achieved by monitoring the spontaneous lateral emissions from the semiconductor laser and adjusting the drive signal to the laser based on the detected emissions. A lateral detector (13, 73) generates a photocurrent from the spontaneous emissions. The detector signal ($I_{lat}$) is compared to a reference signal ($I_{ref}$) and the difference is applied to the drive signal ($I_{las}$) to alter or control the laser output. The magnitudes of the reference signal source and the drive signal source are determined and set based on the desired optical output power of the semiconductor laser measured at a series of temperatures.

5 Claims, 2 Drawing Sheets

6,151,344

AUTOMATIC POWER CONTROL OF SEMICONDUCTOR LASER

FIELD OF THE INVENTION

This invention relates to semiconductor laser devices, and more specifically to monitoring and controlling the operation of the laser devices.

BACKGROUND OF THE INVENTION

Semiconductor lasers, such as edge emitting lasers and vertical cavity surface emitting lasers (VCSEL) are well known, and are formed in a wide variety of configurations. Edge emitting lasers typically consist of a flat junction formed between two pieces of semiconductor material each having been treated with a different type of impurity. When a large electrical current is passed through such a device, laser light emerges from the plane of the junction region. VCSELs, on the other hand, typically include an active area disposed or sandwiched between two mirror stacks on a semiconductor substrate. The laser is activated by driving an electrical current through the two mirror stacks and the active area. This is generally accomplished by placing a first electrode across the mirror stack at one end of the laser and a second electrode across the other mirror stack at the other end of the laser. One of the electrodes generally defines a central opening therethrough for the emission of light.

In operation, a threshold level of current must be forced through the active region of the semiconductor laser for lasing to occur. The threshold level is reached when the stimulated emissions exceeds the internal losses. Upon reaching threshold, the light output rises rapidly with the current, with most of the current resulting in laser emissions.

In applications such as bar code readers, digital versatile discs (DVD), and compact discs (CD), it is necessary or highly desirable to maintain a fixed output power. In a CD, changes in light intensity of the received signal correspond to the data bits being read from the CD. Thus, it is important that the power of the source signal be maintained at a fixed or constant value so that the power of the received data bits corresponds to the actual data rather than the drift of the source signal due to environmental changes.

The power of the source signal may be maintained at a fixed or constant value through Automatic Power Control (APC). APC of semiconductor lasers allows for a constant and consistent output from the lasers. Generally, APC of edge emitting laser devices is easily achieved because edge emitting devices emit light from two ends. APC of edge emitting lasers may be achieved by using one of the light emitting ends to measure the optical power output, which is subsequently used to adjust the electrical power input to the edge emitting device and, thereby, adjusting the optical power output.

APC of VCSEL devices, however, is a much more difficult task because the VCSEL generally emits light from only a single surface, such as the bottom or the top, thus making measurement of the output and subsequent adjustment thereof a difficult task. Conventionally, the task of APC of VCSEL devices has been accomplished by positioning an optical device or devices, such as such as photodiodes, mirrors, beam splitters, or the like, in the optical path of the emission from the VCSEL device. Manually positioning the optical devices presents several problems and disadvantages such as, high manufacturing cost, lack of repeatability, and poor quality control, thus prohibiting high volume manufacturing.

It can be readily seen that conventional APC of VCSEL devices has several disadvantages and problems, thus not easily enabling their manufacture in volume applications. Accordingly, it would be advantageous to have a method and apparatus for controlling the power of semiconductor lasers, particularly VCSEL devices, that are reliable, cost efficient, and compatible with standard semiconductor processes.

BRIEF DESCRIPTION OF THE DRAWINGS

The various aspects and embodiments of the present invention will be hereinafter described in reference to the drawing figures, in which like reference characters indicate corresponding elements throughout the several views and in which.

DETAILED DESCRIPTION OF THE DRAWINGS

Generally, the present invention provides a method and an apparatus for controlling the output power of a semiconductor laser. More particularly, the present invention provides a method for monitoring emissions from a laser and using this information for controlling the output power of the semiconductor laser. A laterally integrated photodetector, such as a photodiode, controls the power output of a laser, such as an edge emitting laser or a vertical cavity surface emitting laser (VCSEL), by monitoring or detecting the lateral spontaneous emissions from the laser. The lateral detector generates a photocurrent from the spontaneous emissions which is compared to a reference signal. The difference between the photocurrent and reference signal is used to alter the drive signal to the laser and thereby control the output power of the laser.

Figure 1:
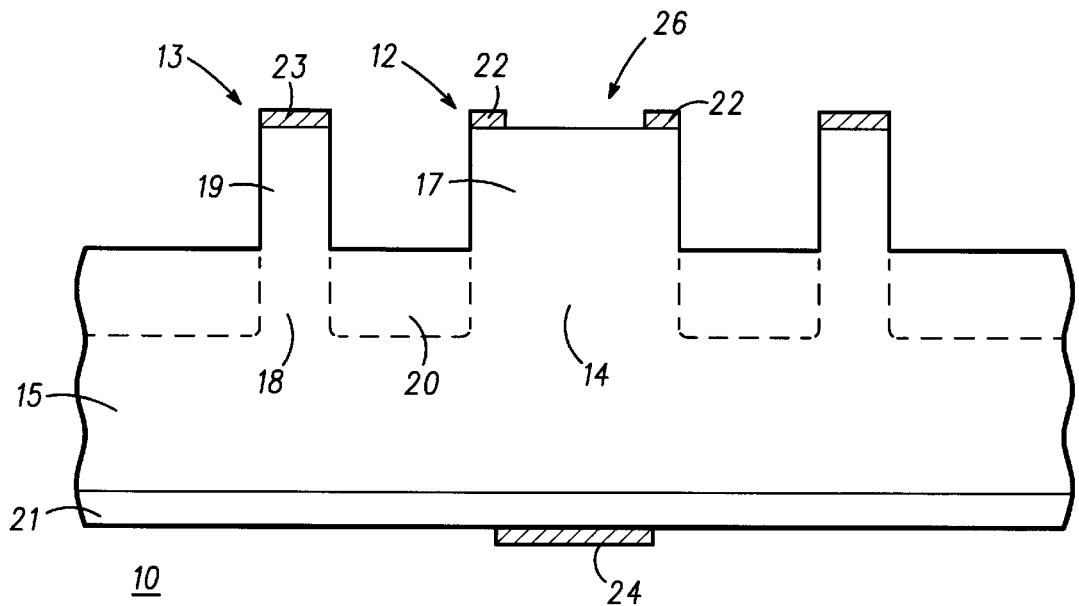
FIG. 1 is a partial cross-sectional view of a semiconductor device in accordance with the present invention.

Turning now to the drawings, attention is first directed to FIG. 1 which illustrates a cross-sectional view of a semiconductor device 10 in accordance with a first embodiment of the present invention. Semiconductor device 10 includes a VCSEL 12 and a monolithically integrated lateral detector 13. VCSEL 12 has an active region 14 disposed or sandwiched between a first mirror stack 15 and a second mirror stack 17. Lateral detector 13 is located adjacent VCSEL 12 and has an active region 18 sandwiched between first mirror stack 15 and a second mirror stack 19. Active region 18 is coextensive with active region 14 of VCSEL 12 and an isolation region 20 is formed in coextensive portions thereof. In other words, a single active region is divided by isolation region 20 into active region 18 of lateral detector 13 and active region 14 of VCSEL 12 with isolation region 20 formed in a coextensive region in between and acting as a waveguide for propagating lateral emissions from VCSEL 12 to lateral detector 13.

Mirror stack 15 is formed on a substrate 21. Electrical contacts 22 and 23 are formed on mirror stacks 17 and 19, respectively. Electrical contacts 22 and 23 are referred to as laser anode and a detector anode, respectively. An electrical contact 24 is formed either within the bottom mirror stack 15, below mirror stack 15, or on the bottom surface of substrate 21. Electrical contact 22 defines a window 26 for the emission of light from VCSEL 12.

Active regions 14 and 18 and isolation region 20 can be formed from an active layer (not shown) such as a quantum well. The quantum well can be formed between two cladding layers (not shown). Isolation region 20 may be formed by a single or multi-energy implant that isolates electrical contacts 22 and 23. By way of example, laser anode 22 and detector anode 23 are electrically isolated at greater than 1 mega-ohm by isolation region 20. This ensures that any leakage current is small compared with the current induced in the lateral detector by spontaneous emissions. Electrical contact 22 defines a window 26 for the emission of light from VSCEL 12 through mirror stack 17. An opposing electrical contact 24 is positioned over the lower surface of mirror stack 15, typically opposing the opposing surface of a substrate upon which device 10 is formed. Mirror stacks 17 and 19 may suitably be formed by techniques such as etching.

Figure 2:
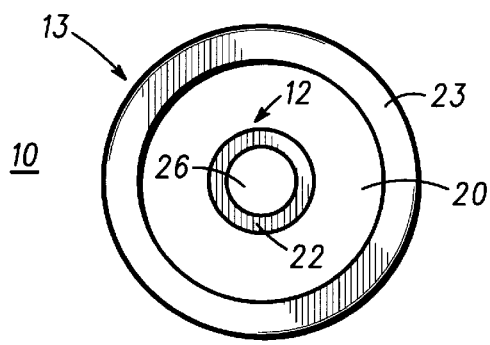
FIG. 2 is a top view of the semiconductor device of FIG. 1.

Referring now to FIG. 2, a top view of semiconductor device 10 is illustrated. More particularly, FIG. 2 illustrates a top view of electrical contacts 22 and 23, window 26, and isolation region 20. In addition, FIG. 2 illustrates lateral detector 13 encircling VCSEL 12. By completely encircling VCSEL 12, lateral detector 13 maximizes the amount of spontaneous detector current generated.

Referring again to FIG. 1, in operation, a voltage applied across electrical contacts 22 and 24 generates a current through VCSEL 12. Lasing generally occurs when a threshold level of current is driven through VCSEL 12. Preferably, lateral detector 13 is either reverse biased or has a zero bias. When VCSEL 12 is forward biased, light is generated in active region 14, emitted through window 26, and propagated through isolation region 20. The light that propagates through isolation region 20 is known as lateral spontaneous emissions of VCSEL 12. Isolation region 20 acts as a waveguide by directing light from active region 14 to active region 19 of lateral detector 13. When light is absorbed by active region 18, a photocurrent is generated in lateral detector 13. The light emission is proportional to the carrier density prior to lasing. Once threshold is reached, the quasi Fermi levels of VCSEL 12 clamp and the carrier density becomes fixed, clamping further spontaneous light emissions.

Figure 3:
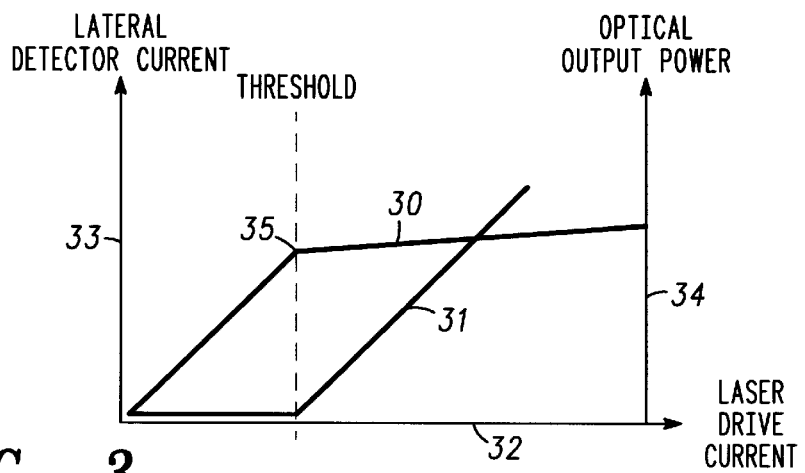
FIG. 3 is a graph illustrating the spontaneous emissions and output power of a semiconductor laser as a function of drive current.

The expected optical output power and lateral detector current variation with laser drive current is illustrated in FIG. 3. Curves 30 and 31 represent the lateral detector output and light ouput power respectively as a function of the laser drive current. Horizontal axis 32 designates laser drive current, vertical axis 33 designates the lateral detector current, and vertical axis 34 designates the optical output power. As can be seen, the lateral detector current clamps at threshold level current, resulting in an abrupt change in curve 30 at a point designated 35. Subsequently, the spontaneous emissions remain substantially constant. Lasing typically occurs once a threshold of current is driven through the laser resulting in an abrupt change in curve 31 at point 35. Subsequently, the optical output power increases as the laser drive current increases.

Figure 4:
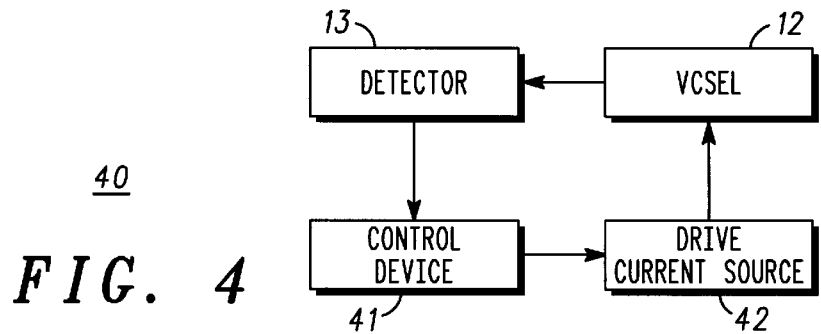
FIG. 4 is a simplified schematic diagram of a feedback control system.

FIG. 4 illustrates a simplified block diagram of a feedback system 40 for controlling the optical output power of VCSEL 12. Feedback system 40 controls the output power of VCSEL 12 by monitoring the spontaneous lateral emissions of VCSEL 12 and adjusting the drive current provided to VCSEL 12 based on a photocurrent generated from the spontaneous emissions. More particularly, lateral detector 13 produces a photocurrent in response to spontaneous lateral emissions from VCSEL 12. The photocurrent is provided to a control device 41. Control device 41 receives and processes the photocurrent signal and regulates the current employed to drive VCSEL 12. Particularly, control device 41 provides a control signal or correction signal based on the received photocurrent signal to a drive signal or current source 42. Drive current source 42 receives the control signal and based on the control signal, increases or decreases the drive current supplied to VCSEL 12 which in turn controls the optical output power of VCSEL 12, as illustrated by curve 31 of FIG. 3.

Figure 5:
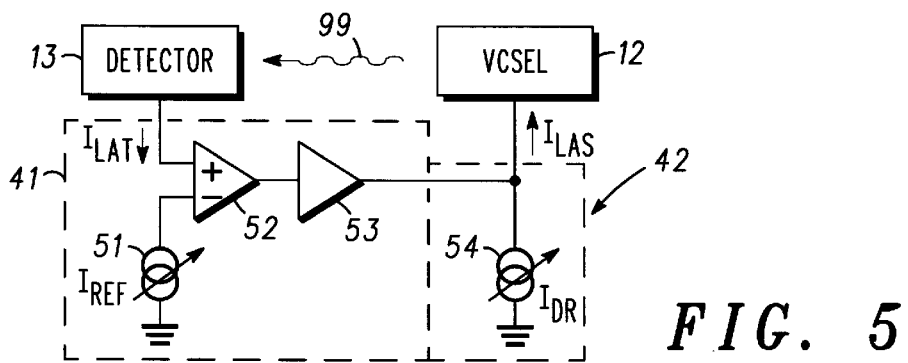
FIG. 5 is a simplified schematic diagram of a feedback control system for automatic power control in accordance with a first embodiment of the present invention.

FIG. 5 illustrates a simplified schematic diagram of feedback control system 40 in accordance with a first embodiment of the present invention. In accordance with the first embodiment, control device 41 suitably comprises current source 51, signal comparator 52, and a gain stage or amplifier 53. Drive current source 42 suitably comprises current source 54. Current source 51 comprises a variable current source having an output terminal for providing a reference signal or reference current, $I_{ref}$, and a power terminal coupled for receiving a power supply voltage (e.g., ground). Comparator 52 includes an inverting input terminal, a non-inverting input terminal, and an output terminal. The inverting input terminal is coupled to the output terminal of current source 51 for receiving reference current $I_{ref}$ produced by current source 51. The non-inverting input terminal of comparator 52 is coupled to an input terminal of control device 41 which is suitably coupled for receiving the photocurrent signal $I_{lat}$ output from detector 13. Amplifier 53 comprises a variable gain amplifier and includes an input terminal coupled to the output terminal of comparator 52 and an output terminal coupled to an output terminal of control device 41. Current source 54 of drive current source 42 comprises a variable current source having an output terminal for providing a drive current $I_{DR}$ an a power terminal coupled for receiving a power supply voltage (e.g., ground). The output terminal of current source 54 is coupled to an input terminal of drive current source 42, which is coupled to the output terminal of control device 41 for receiving the control signal from control device 41 and an input terminal of VCSEL 12.

To control the optical output power of VSCEL 12, feedback control system 40 is initialized and VCSEL 12 calibrated. Generally, during initialization, current source 54 drives VCSEL 12 to a predetermined desired optical output power over a series of temperatures and the photocurrent generated from lateral emissions 99 of VCSEL 12 and required drive current from current source 54 are measured at the various temperatures. The requisite gain of amplifier 53, the currents of current sources 51 and 54 are each determined and set to enable feedback control system 40 to control the optical output power of VCSEL 12 to a desired output power level.

More particularly, the gain required from amplifier 53 is determined by monitoring the photocurrent output signal from detector 13, $I_{lat}$, and the current, $I_{las}$, required for VCSEL 12 to produce a desired optical output power at a first temperature and a second temperature. More particularly, at a first temperature (T1), VCSEL 12 is driven to produce a desired optical power output, for purposes of example only, 1 milliwatt (mW). The photocurrent output signal of detector 13 ($I_{lat}$) is measured at the first temperature T1 and the desired VCSEL 12 output power of 1 mW. Similarly, the current ($I_{las}$) required to drive VCSEL 12 to the desired output power of 1 mW is measured at the first temperature, T1. VCSEL 12 is then driven to produce the desired optical output power of 1 mW at a second temperature T2 and detector 13 current ($I_{lat}$) and the current ($I_{las}$) required by VCSEL 12 to achieve the desired output power again measured. The gain of amplifier 53 is determined by dividing the difference in laser current ($\Delta I_{las}$(T2-T1)) by the difference in detector current ($\Delta I_{lat}$(T2-T1)); stated in equation form:

$$A=\Delta I_{las}(T2-T1)/(\Delta I_{lat}(T2-T1)$$

where, A is gain. Thus, the gain of variable gain amplifier 53 is set to A.

Temperatures T1 and T2 are typically selected to be the lower and upper temperature limits expected to be seen in operation under normal or worst case conditions. For example, T1 may be selected to be 15 degrees Celsius (° C.) and T2 may be selected to be 65° C.

To determine and set the currents of variable current sources 53 and 54, VCSEL 12 is driven to produce the desired optical power output of 1 mW at a third temperature T3. Temperature T3 is chosen to be between temperatures T1 and T2 and preferably relatively close to anticipated operating conditions and intermediate to temperatures T1 and T2. The photocurrent generated in response to spontaneous lateral emissions 99 of VCSEL 12 operating at the desired optical output power at T3 and the current required to achieve the desired output power at T3 are measured. Current source 53 is set to provide a current, $I_{ref}$, approximately equal to the photocurrent generated by detector 13 in response to lateral emissions 99 of VCSEL 12 at 1 mW output power and T3, $I_{lat}$(T3). Current source 54 is set to provide a current, $I_{dr}$, approximately equal to the current required for VCSEL 12 to output 1 mW optical power at T3, $I_{las}$(T3).

In operation, as temperature fluctuates and VCSEL 12 ages, the current $I_{las}$ required for VCSEL 12 to output the desired 1 mW optical power changes. Feedback control system 40 monitors the spontaneous lateral emissions 99 and increases or decreases, via control device 41, the current supplied to VCSEL 12. More particularly, the photocurrent signal, $I_{lat}$, generated by detector 13 in response to the spontaneous lateral emissions 99 of VCSEL 12 is received at the non-inverting input of comparator 52. Comparator 52 compares the photocurrent signal, $I_{lat}$, to the current, $I_{ref}$, of current source 51, which is received at the inverting input of comparator 52, and outputs an error signal to the input of amplifier 53. Amplifier 53 receives and amplifies the error signal in accordance with the gain factor, A, determined and set during initialization, and outputs a control or correction signal to drive current source 42. Drive current source 42 receives the correction signal which adds to or subtracts from the current, $I_{dr}$, of current source 54 to produce the current, $I_{las}$, required to drive VCSEL 12 to the desired optical output power of 1 mW (used for example purposes). Thus, by monitoring the spontaneous lateral emissions and adjusting the current provided to drive VCSEL 12, the optical output power of VCSEL 12 is automatically controlled to the desired optical output power.

Figure 6:
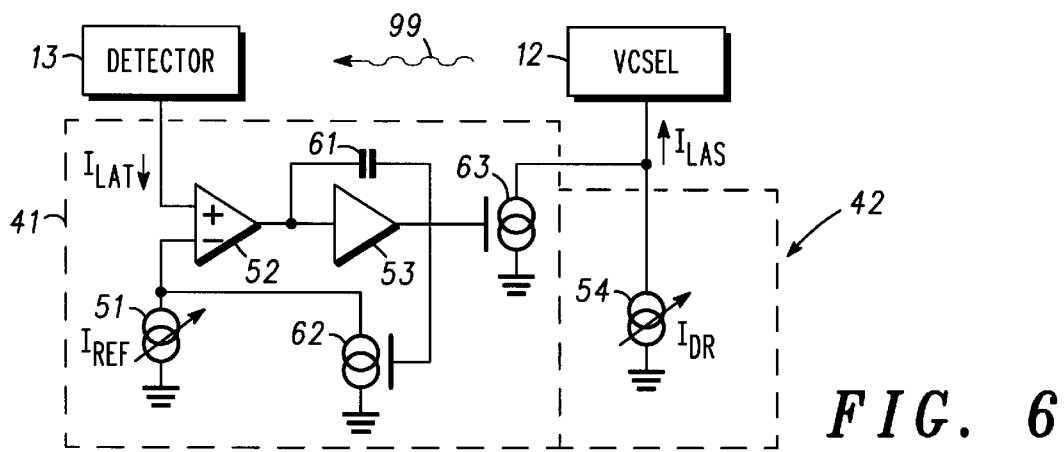
FIG. 6 is a simplified schematic diagram of a feedback control system for automatic power control in accordance with a second embodiment of the present invention.

FIG. 6 illustrates a simplified schematic diagram of feedback control system 40 in accordance with a second embodiment of the present invention. In accordance with the second embodiment of the present invention, feedback control system 40 further comprises a capacitor 61 having a first terminal coupled to the input terminal of amplifier 53 and a second terminal coupled to the output terminal of amplifier 53, a first voltage controlled current source 62, and a second voltage controlled current source 63.

Current sources 62 and 63 respectively comprise voltage controlled current sources, each having an input terminal, an output terminal, and a power terminal coupled for receiving a power supply voltage (e.g., ground). In accordance with the second embodiment, the input terminal of current source 62 is coupled to the output terminal of amplifier 53 and the output terminal is coupled to the output terminal of current source 51. Current source 63 is suitably coupled between the output terminal of amplifier 53 and the output terminal of control device 41. Particularly, the input terminal of current source 63 is coupled to the output terminal of amplifier 53 and the output terminal is coupled to the output terminal of control device 41.

Feedback control system 40, in accordance with the second embodiment of the present invention, is initialized similar to the manner described herein with regard to the first embodiment of the present invention. Particularly, the lateral emissions and current required to drive VCSEL 12 at a desired optical output power (e.g., 1 mW) are measured over a series of temperatures, T1, T2, and T3. The gain of amplifier 53 is determined and set as described with regard to the first embodiment. The current, IDR, of current source 54 is set to provide the minimum current needed for VCSEL 12 to output the desired optical power over the temperature range to which feedback control system 40 is calibrated (T1 to T2). Current source 51 is set to provide a current, $I_{ref}$, approximately equal to the photocurrent, $I_{LAT}$, generated by detector 13 when VCSEL 12 is driven by current source 54 at the minimum current condition.

Feedback control system 40 as described in relation to the second embodiment operates similarly to that described in relation to the first embodiment of the present invention. In accordance with the second embodiment, feedback control system 40 provides negative feedback via current source 62, thereby ensuring stability. Particularly, amplifier 53 and capacitor 61 form an integrator which receives the error signal from comparator 52 and outputs an integrated correction signal in the form of a voltage to voltage controlled current sources 62 and 63. Current sources 62 and 63 produce a current in response the received voltage. The current of current source 62 is fed back to the inverting input of comparator 52. Providing negative feedback to comparator 52 creates a self-zeroing effect, thereby preventing the error signal from continuously and incorrectly increasing, as could potentially occur if system 40 became unstable as a result of positive feedback. The current of current source 63 is provided to drive current source 42 where it is added to the current $I_{dr}$ of current source 54 to produce the current $I_{las}$ required for VCSEL 12 to output the desired optical power. Thus, by monitoring the spontaneous lateral emissions and adjusting the current provided to drive VCSEL 12, the optical output power of VCSEL 12 is automatically controlled.

Figure 7:
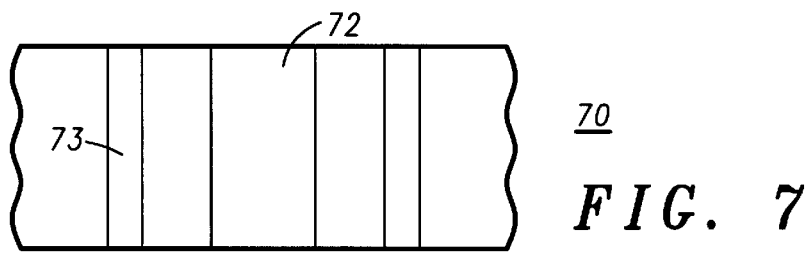
FIG. 7 is a top view of a portion of a semiconductor device in accordance with the present invention.

FIG. 7 is a top view of a semiconductor device 70 in accordance with a second embodiment of the present invention. Semiconductor device 70 includes an edge emitting laser 72 and a lateral detector 73. Lateral detector 73 is adjacent to edge emitting laser 72.

Lateral detector 73 monitors spontaneous emissions of edge emitting laser 72. Lateral detector 73 generates a photocurrent in response to the spontaneous emissions of edge emitting laser 72. Edge emitting laser 72 and lateral detector 73 can be used in a feedback system similar to feedback system 40 (FIGS. 4–6) where edge emitting laser 72 replaces VCSEL 12 and lateral detector 73 replaces lateral detector 13. A control device, such as, for example, control device 41 receives and processes the photocurrent signal and regulates the current employed to drive edge emitting laser 72. Particularly, control device 41 provides a control signal or correction signal based on the received photocurrent signal to a drive current source, such as, for example, drive current source 42. Drive current source 42 receives the control signal and based on the control signal, increases or decreases the drive current supplied to edge emitting laser 72 which in turn controls the optical output power of edge emitting laser 72.

By now it should be appreciated that a method and apparatus for automatically controlling the optical output power of a semiconductor laser has been provided. An advantage of the present invention is that it provides a method and apparatus for controlling the output power of a VCSEL which does not require manually positioning optical devices in the optical path of the emissions of the VCSEL device and thus, avoids the problems associated with prior approaches to power control. Using the apparatus and methods of the present invention disclosed in relation to the first embodiment of the present invention, the present inventors have found that the optical output power may be controlled to a desired power level within approximately ±3%.

While the various aspects and embodiments of the present invention have been discussed in reference to an individual laser device, the present invention is not so limited. The present invention is also applicable to semiconductor laser arrays, such as a VCSEL array. The present invention provides automatic power control to a VCSEL array by providing a detector laterally integrated with each VCSEL device of the array. In accordance with this aspect of the present invention, each VCSEL device of the array is individually calibrated in the manner discussed above to achieve APC. In accordance with an alternate embodiment of this aspect of the invention, VCSEL devices close to one another may be calibrated as a group. VCSEL devices close to one another typically have substantially similar and often the same characteristics, thereby allowing for the VCSEL devices close to one another to be calibrated as a group as opposed to each device being calibrated individually. Alternatively, a complete VCSEL wafer may be calibrated as a whole rather than each device being calibrated individually or as a group.

While the present invention has been explained in the context of particular embodiments of semiconductor lasers, it should be appreciated that the present invention is not limited to the particular semiconductor lasers discussed herein. For example, while preferably the lateral detector is integrated with the semiconductor laser to maximize the amount of spontaneous detector current generated, the lateral detector may be formed spaced apart from the semiconductor laser.

Various other changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of controlling the output power of a semiconductor laser comprising the steps of:

using a lateral detector to monitor spontaneous lateral emissions from the semiconductor laser;

generating a difference signal from a reference signal and an output signal of the lateral detector indicative of the spontaneous lateral emissions detected by the lateral detector;

adjusting a magnitude of the difference signal in accordance with a gain factor determined by:

measuring the output signal of the lateral detector at a first temperature and a second temperature, wherein the second temperature is greater than the first temperature;

measuring the drive signal at the first temperature and the second temperature;

generating a first difference current by subtracting a value of the output signal of the lateral detector at the first temperature from a value of the output signal of the lateral detector at the second temperature;

generating a second difference current by subtracting a value of the drive signal at the first temperature from a value of the drive signal at the second temperature; and dividing second difference current by the first difference current to generate the gain factor; and providing the difference signal to the semiconductor laser to control the output power of the semiconductor laser.

2. A method of controlling an output power of a semiconductor laser having a lateral detector, the method comprising the steps of:

using the lateral detector to monitor spontaneous lateral emissions from the semiconductor laser;

measuring an output signal of the lateral detector at a first temperature and a second temperature;

measuring the output signal of the lateral detector at a third temperature, wherein the third temperature is between the first temperature and the second temperature;

setting a reference signal to a value of the output signal of the lateral detector measured at the third temperature;

generating a difference signal from the output signal of the lateral detector and the reference signal; and altering a drive signal to the semiconductor laser in accordance with the difference signal.

3. The method of claim 2 wherein the step of initializing the drive signal comprises the steps of:

measuring the drive signal at the first temperature and the second temperature;

measuring the drive signal at the third temperature; and setting the drive signal to a value of the drive signal measured at the third temperature.

4. The method of claim 3 wherein the steps of measuring the output of the lateral detector comprise measuring the output of the lateral detector at a desired output power of the semiconductor laser.

5. The method of claim 4 wherein the steps of measuring the drive signal comprise measuring the drive signal at the desired output power of the semiconductor laser.

* * * * *